United States Patent
Lee et al.

(10) Patent No.: US 11,778,890 B2
(45) Date of Patent: *Oct. 3, 2023

(54) ORGANIC LAYER DEPOSITION APPARATUS AND METHOD OF MANUFACTURING ORGANIC LIGHT-EMITTING DISPLAY APPARATUS USING THE SAME

(71) Applicant: Samsung Display Co., Ltd., Yongin-Si (KR)

(72) Inventors: Su-Hwan Lee, Yongin (KR); Un-Cheol Sung, Yongin (KR); Mu-Hyun Kim, Yongin (KR); Dong-Kyu Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/732,900

(22) Filed: Apr. 29, 2022

(65) Prior Publication Data

US 2022/0255050 A1 Aug. 11, 2022

Related U.S. Application Data

(63) Continuation of application No. 16/713,752, filed on Dec. 13, 2019, now Pat. No. 11,335,892, which is a (Continued)

(30) Foreign Application Priority Data

May 16, 2013 (KR) .................... 10-2013-0056039

(51) Int. Cl.
*C23C 14/24* (2006.01)
*H10K 71/00* (2023.01)
(Continued)

(52) U.S. Cl.
CPC .......... *H10K 71/00* (2023.02); *C23C 14/042* (2013.01); *C23C 14/24* (2013.01); *C23C 14/568* (2013.01); *H01L 21/6776* (2013.01)

(58) Field of Classification Search
None
See application file for complete search history.

(56) References Cited

U.S. PATENT DOCUMENTS 6,645,357 B2 * 11/2003 Powell .................... C23C 14/34
204/298.11
6,776,847 B2   8/2004 Yamazaki et al.
(Continued)

FOREIGN PATENT DOCUMENTS

CN     1723741 A    1/2006
CN   101892455 A   11/2010
(Continued)

OTHER PUBLICATIONS

KR Office Action Report, Application No. 10-2013-0056039, dated May 15, 2019, 10 pages.
(Continued)

*Primary Examiner* — David P Turocy
(74) *Attorney, Agent, or Firm* — Innovation Counsel LLP

(57) ABSTRACT

An organic layer deposition apparatus and a method of manufacturing an organic light-emitting display device by using the apparatus. In particular, an organic layer deposition apparatus that is more easily manufactured and is suitable for use in mass production of large substrates while performing high-definition patterning thereon, as well as a method of manufacturing an organic light-emitting display device by using such an apparatus.

13 Claims, 9 Drawing Sheets

Related U.S. Application Data continuation of application No. 14/037,099, filed on Sep. 25, 2013, now abandoned.

(51) Int. Cl.
  *C23C 14/04* (2006.01)
  *C23C 14/56* (2006.01)
  *H01L 21/677* (2006.01)

(56) References Cited

U.S. PATENT DOCUMENTS

| | | | |
|---|---|---|---|
| 7,345,417 B2 | 3/2008 | Shitagaki et al. | |
| 7,462,244 B2 | 12/2008 | Utsugi et al. | |
| 8,696,815 B2 | 4/2014 | Choi et al. | |
| 9,450,140 B2 | 9/2016 | Jo et al. | |
| 2004/0086639 A1 | 5/2004 | Grantham et al. | |
| 2005/0016462 A1 | 1/2005 | Yamazaki | |
| 2007/0009652 A1* | 1/2007 | Manz | C23C 14/20 427/58 |
| 2010/0047474 A1 | 2/2010 | Neal et al. | |
| 2010/0297348 A1 | 11/2010 | Im et al. | |
| 2011/0033619 A1* | 2/2011 | Lee | C23C 14/12 427/248.1 |
| 2011/0048320 A1 | 3/2011 | Choi et al. | |
| 2011/0052791 A1 | 3/2011 | Jo et al. | |
| 2011/0052795 A1 | 3/2011 | Choi et al. | |
| 2011/0165327 A1 | 7/2011 | Park et al. | |
| 2011/0195184 A1* | 8/2011 | Onken | C23C 16/4401 427/248.1 |
| 2012/0068199 A1 | 3/2012 | Sung et al. | |
| 2012/0100282 A1* | 4/2012 | Lee | C23C 14/12 427/66 |
| 2012/0174865 A1 | 7/2012 | Choi et al. | |
| 2012/0301986 A1 | 11/2012 | Choi et al. | |
| 2013/0009177 A1 | 1/2013 | Chang et al. | |
| 2013/0264191 A1 | 10/2013 | Schulmeyer et al. | |
| 2013/0316079 A1 | 11/2013 | Ellrich et al. | |

FOREIGN PATENT DOCUMENTS

| | | | |
|---|---|---|---|
| CN | 102005541 A | | 4/2011 |
| CN | 102867924 A | | 1/2013 |
| CN | 104167511 B | | 3/2018 |
| JP | 56090975 A | | 7/1981 |
| JP | S56-173663 | | 12/1981 |
| JP | 61030661 A | | 2/1986 |
| JP | 2003-313654 A | | 11/2003 |
| JP | 2006274398 A | * | 10/2006 |
| JP | 2006274398 A | | 10/2006 |
| JP | 2006-302898 A | | 11/2006 |
| JP | 2006-274398 A | | 12/2006 |
| JP | 2007051330 A | | 3/2007 |
| JP | 2007051330 A | * | 3/2007 |
| JP | 2011-049167 A | | 3/2011 |
| JP | 2011-052318 A | | 3/2011 |
| KR | 10-2004-0063916 A | | 7/2004 |
| KR | 10-2008-0078290 A | | 8/2008 |
| KR | 10-2011-0022512 A | | 3/2011 |
| KR | 10-2011-0025034 A | | 3/2011 |
| KR | 10-2011-0025035 A | | 3/2011 |
| KR | 10-2012-0029166 A | | 3/2012 |
| KR | 10-2012-0081811 A | | 7/2012 |
| WO | 2004/054325 A1 | | 6/2004 |
| WO | 2007/099929 A1 | | 9/2007 |

OTHER PUBLICATIONS

Machine Translation of JP-2006274398-A based on "Sep. 26, 2019 List of references".

* cited by examiner

ORGANIC LAYER DEPOSITION APPARATUS AND METHOD OF MANUFACTURING ORGANIC LIGHT-EMITTING DISPLAY APPARATUS USING THE SAME

CROSS-REFERENCE TO RELATED PATENT APPLICATION

This application is a continuation of U.S. patent application Ser. No. 16/713,752 filed Dec. 13, 2019, now U.S. Pat. No. 11,335,892, which is a continuation application of U.S. patent application Ser. No. 14/037,099 filed on Sep. 25, 2013, now abandoned, which claims priority under 35 USC § 119 to Korean Patent Application No. 10-2013-0056039, filed on May 16, 2013, in the Korean Intellectual Property Office, the disclosures of which are incorporated herein in their entirety by reference.

BACKGROUND

1. Field

Aspects of the present invention relate generally to organic light-emitting displays. More specifically, aspects of the present invention relate to an organic layer deposition apparatus and a method of manufacturing an organic light-emitting display device by using said organic layer deposition apparatus.

2. Description of the Related Art

Organic light-emitting display devices have wider viewing angles, better contrast characteristics, and faster response speeds than many other display devices, and thus have drawn attention as viable next-generation display devices.

An organic light-emitting display device includes intermediate layers (including an emission layer) disposed between a first electrode and a second electrode. The electrodes and the intermediate layers may be formed using various methods, one of which is an independent deposition method. When an organic light-emitting display device is manufactured by using this deposition method, a fine metal mask (FMM) having the same pattern as that of an organic layer to be formed is disposed to closely contact a substrate on which the organic layer and the like are formed, and an organic layer material is deposited on the FMM to form the organic layer having the desired pattern.

However, deposition methods using such an FMM present difficulties in manufacturing larger organic light-emitting display devices using a large mother glass. For example, when such a large mask is used, the mask may bend under its own weight, thereby distorting the resulting pattern.

Moreover, the processes of aligning a substrate and an FMM to closely contact each other, performing deposition thereon, and separating the FMM from the substrate are time-consuming, resulting in a long manufacturing time and low production efficiency.

Information disclosed in this Background section was already known to the inventors of the present invention before achieving the present invention or is technical information acquired in the process of achieving the present invention. Therefore, it may contain information not in the prior art.

SUMMARY

Aspects of the present invention are directed toward organic layer deposition apparatuses that are more easily manufactured, and are suitable for use in the mass production of a large substrate while enabling high-definition patterning. Methods of manufacturing organic light-emitting display devices by using the organic layer deposition apparatuses are also contemplated.

According to an embodiment of the present invention, there is provided an organic layer deposition apparatus comprising: a conveyer system comprising a moving unit configured both for having a substrate coupled thereto and to move along with the substrate, a first conveyer unit for moving the moving unit in a first direction while the substrate is coupled thereto, and a second conveyer unit for moving the moving unit in a second direction opposite to the first direction when the substrate is separated therefrom after a deposition has been completed; and a deposition unit comprising at least one organic layer deposition assembly for depositing an organic layer on the substrate while it is coupled to the moving unit, wherein each of the organic layer deposition assemblies comprises: at least one deposition source for discharging a deposition material; a deposition source nozzle unit that is disposed at a side of the at least one deposition source, wherein at least one deposition source nozzle is formed in the deposition source nozzle unit; a patterning slit sheet that is disposed to face the deposition source nozzle unit and that comprises a plurality of patterning slits extending along a predetermined direction; a shielding member that is disposed between the substrate and the at least one deposition source and that is configured to block the deposition material vaporized from the at least one deposition source; and a mesh member that is disposed on a side of the shielding member and that is configured to prevent dripping of the deposition material from the shielding member, wherein the moving unit is configured to be cyclically moved between the first conveyer unit and the second conveyer unit, and wherein, when coupled to the moving unit, the substrate is spaced apart from the organic layer deposition assembly by a predetermined distance while being transferred by the first conveyer unit.

The shielding member may be operably movable so as to prevent deposition of the deposition material upon the substrate.

The shielding member may be configured to be moved between the at least one deposition source and the patterning slit sheet.

The mesh member may be coupled to the shielding member so as to move with the shielding member.

The shielding member may be disposed at a side of the deposition source and is positioned and shaped so as to channel the deposition material vaporized from the at least one deposition source toward the substrate.

The shielding member may be shaped so as to at least partially surround the deposition source.

The mesh member may be coupled to the shielding member and both the mesh member and the shielding member are positioned proximate to a side of the deposition source.

Each of the organic layer deposition assemblies may include: a plurality of deposition sources; and a plurality of shielding members that are movably positioned between respective ones of the plurality of deposition sources and the patterning slit sheet.

The plurality of shielding members may be positionable to prevent deposition of the deposition material on the substrate.

The shielding member may be shaped and positioned to cover a boundary area of the substrate.

The shielding member may be configured to move along with the substrate while covering the boundary area of the substrate.

The slits of the patterning slit sheet may be shaped and positioned so that the deposition material discharged from the at least one deposition source is deposited on the substrate in a predetermined pattern.

The patterning slit sheet may have a smaller size than the substrate in at least one of the first direction and a third direction different from the first direction.

The first conveyer unit and the second conveyer unit are configured to pass through the deposition unit.

The first conveyer unit and the second conveyer unit may be disposed parallel to each other.

According to an embodiment of the present invention, there is provided a method of manufacturing an organic light-emitting display device, the method comprising: conveying a moving unit into a chamber, the moving unit having a substrate coupled thereto, the conveying performed by a first conveyer unit installed to pass into the chamber; forming an organic layer on the substrate by depositing a deposition material from an organic layer deposition assembly on the substrate while the substrate is moved relative to the organic layer deposition assembly, the organic layer deposition assembly being positioned in the chamber and spaced apart from the substrate by a predetermined distance; and after the substrate is separated from the moving unit, conveying the moving unit with a second conveyer unit installed to pass through the chamber, wherein the forming an organic layer further comprises blocking the deposition material discharged from the organic layer deposition assembly from being deposited upon the substrate, the blocking being performed with a shielding member having a mesh member coupled thereto.

The organic layer deposition assembly may comprise: a deposition source for discharging a deposition material; a deposition source nozzle unit disposed at a side of the deposition source and comprising a plurality of deposition source nozzles; and a patterning slit sheet facing the deposition source nozzle unit and comprising a plurality of arranged patterning slits, wherein the patterning slits are shaped and arranged so that deposition material discharged from the deposition source passes through the patterning slit sheet to be deposited on the substrate in a predetermined pattern.

The shielding member may be configured to be disposed between the substrate and the deposition source to prevent the deposition material vaporized from the deposition source from being deposited on the substrate, wherein the mesh member is disposed on a side of the shielding member so as to prevent dripping of the deposition material from the shielding member.

The shielding member may be operably movable so as to prevent deposition of the deposition material upon the substrate.

The shielding member may be configured to be moved between the deposition source and the patterning slit sheet.

The mesh member may be coupled to the shielding member so as to move with the shielding member.

The shielding member may be disposed at a side of the deposition source and be positioned and shaped so as to channel the deposition material vaporized from the deposition source toward the substrate.

The shielding member may be shaped so as to at least partially surround the deposition source.

The mesh member may be coupled to the shielding member and both the mesh member and the shielding member may be positioned proximate to a side of the deposition source.

The organic layer deposition assembly may include: a plurality of deposition sources; and a plurality of shielding members that are movably positionable between respective ones of the plurality of deposition sources and the patterning slit sheet.

The plurality of shielding members may be positionable to prevent deposition of the deposition material on the substrate.

The shielding member may be shaped and positioned to cover a boundary area of the substrate.

The shielding member may be configured to move along with the substrate while covering the boundary area of the substrate.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
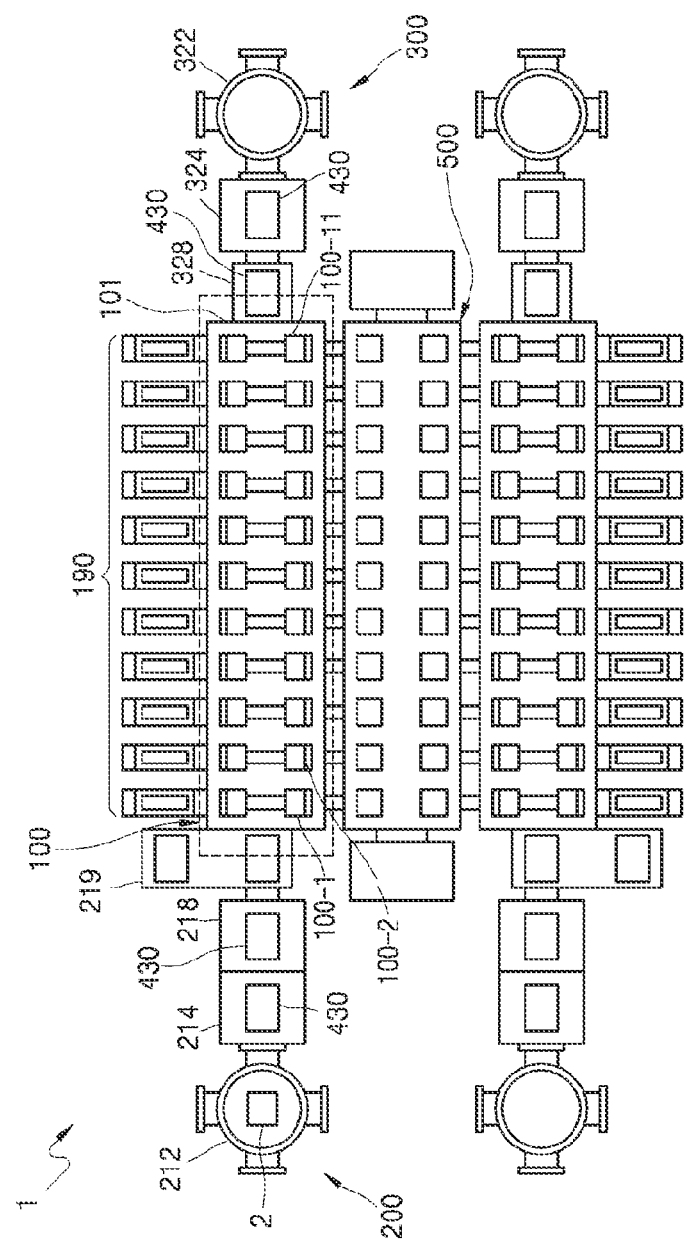
FIG. 1 is a schematic plan view illustrating a structure of an organic layer deposition apparatus according to an embodiment of the present invention.

Reference will now be made in detail to the present embodiments of the present invention, examples of which are illustrated in the accompanying drawings, which are not necessarily to scale, wherein like reference numerals refer to like elements throughout. The embodiments are described below in order to explain aspects of the present invention by referring to the figures. Expressions such as "at least one of," when preceding a list of elements, modify the entire list of elements and do not modify the individual elements of the list.

Figure 2:
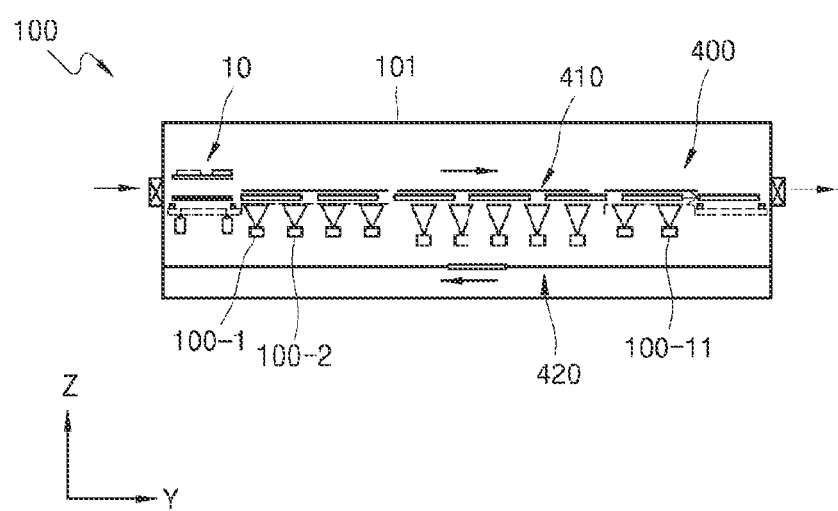
FIG. 2 is a schematic side view of a deposition unit of the organic layer deposition apparatus of FIG. 1, according to an embodiment of the present invention.

FIG. 1 is a schematic plan view illustrating a structure of an organic layer deposition apparatus 1 according to an embodiment of the present invention. FIG. 2 is a schematic side view of a deposition unit 100 of the organic layer deposition apparatus 1 of FIG. 1, according to an embodiment of the present invention.

Referring to FIGS. 1 and 2, the organic layer deposition apparatus 1 includes the deposition unit 100, a loading unit 200, an unloading unit 300, and a conveyer unit or system 400.

The loading unit 200 may include a first rack 212, a transport chamber 214, a first inversion chamber 218, and a buffer chamber 219.

A number of substrates 2, onto which a deposition material has not yet been applied, are stacked up on the first rack 212. A transport robot included in the transport chamber 214 picks up one of the substrates 2 from the first rack 212, disposes it on a moving unit 430 transferred by a second conveyer unit 420, and moves the moving unit 430, on which the substrate 2 is disposed, into the first inversion chamber 218.

The first inversion chamber 218 is disposed adjacent to the transport chamber 214. The first inversion chamber 218 includes a first inversion robot that inverts the moving unit 430 and then loads it on a first conveyer unit 410 of the deposition unit 100.

Referring to FIG. 1, the transport robot of the transport chamber 214 places one of the substrates 2 on a top surface of the moving unit 430, and the moving unit 430, on which the substrate 2 is disposed, is then transferred into the first inversion chamber 218. A first inversion robot of the first inversion chamber 218 inverts the first inversion chamber 218 so that the substrate 2 is turned upside down in the deposition unit 100.

The unloading unit 300 is configured to operate in an opposite manner to the loading unit 200 described above. Specifically, a second inversion robot in a second inversion chamber 328 inverts the moving unit 430 after it has passed through the deposition unit 100 with the substrate 2 disposed thereon, and then moves the moving unit 430, with its substrate 2, into an ejection chamber 324. Then, an ejection robot takes the moving unit 430 and its substrate 2 out of the ejection chamber 324, separates the substrate 2 from the moving unit 430, and then loads the substrate 2 on a second rack 322. The moving unit 430, separated from the substrate 2, is returned to the loading unit 200 via the second conveyer unit 420.

However, the present invention is not limited to the configuration of the above example. For example, when disposing the substrate 2 on the moving unit 430, the substrate 2 may be fixed onto a bottom surface of the moving unit 430 and then moved into the deposition unit 100. In such an embodiment, for example, the first inversion robot of the first inversion chamber 218 and the second inversion robot of the second inversion chamber 328 may be omitted.

The deposition unit 100 may include at least one chamber for deposition. In one embodiment, as illustrated in FIGS. 1 and 2, the deposition unit 100 includes a chamber 101 in which a plurality of organic layer deposition assemblies 100-1 through 100-$n$ may be disposed. Referring to FIG. 1, 11 organic layer deposition assemblies, i.e., the organic layer deposition assembly 100-1, the organic layer deposition assembly 100-2, . . . , and the organic layer deposition assembly 100-11, are disposed in the chamber 101. However, the number of organic layer deposition assemblies may vary according to various factors such as the desired deposition material and deposition conditions. The chamber 101 is maintained in vacuum during the deposition process.

In this regard, some of the 11 organic layer deposition assemblies may be used for deposition to form a common layer, and the rest of the 11 organic layer deposition assemblies may be used for deposition to form a pattern layer. In this embodiment, the organic layer deposition assemblies used for deposition to form a common layer may not include a patterning slit sheet 130 (refer to FIG. 3). According to one embodiment, the 11 organic layer deposition assemblies may be configured such that the organic layer deposition assembly 100-1 performs deposition for forming a hole injection layer (HIL) as a common layer, the organic layer deposition assembly 100-2 performs deposition for forming an injection layer (IL) as a common layer, the organic layer deposition assembly 100-3 and the organic layer deposition assembly 100-4 perform deposition for forming a hole transport layer (HTL) as a common layer, the organic layer deposition assembly 100-5 performs deposition for forming, e.g., an R' material and/or a G' material in the HTL as a common layer, the organic layer deposition assembly 100-6 performs deposition for forming an R" material in the HTL as a common layer, the organic layer deposition assembly 100-7 performs deposition for forming a red emission layer (R EML) as a pattern layer, the organic layer deposition assembly 100-8 performs deposition for forming a green emission layer (G EML) as a pattern layer, the organic layer deposition assembly 100-9 performs deposition for forming a blue emission layer (B EML) as a pattern layer, the organic layer deposition assembly 100-10 performs deposition for forming an electron transport layer (ETL) as a common layer, and the organic layer deposition assembly 100-11 performs deposition for forming an electron injection layer (EIL) as a common layer. The organic layer deposition assemblies described above may also be arranged in various forms and configurations for various processes that may differ from this one.

In the embodiment illustrated in FIG. 1, the moving unit 430 with the substrate 2 fixed thereon may be moved at least to the deposition unit 100 or may be moved sequentially to the loading unit 200, the deposition unit 100, and the unloading unit 300, by the first conveyer unit 410, and the moving unit 430 that has been separated from the substrate 2 in the unloading unit 300 may be moved back to the loading unit 200 by the second conveyer unit 420.

The first conveyer unit 410 passes through the chamber 101 when passing through the deposition unit 100, and the second conveyer unit 420 conveys the moving units 430 back after their substrates 2 are separated.

In the present embodiment, the organic layer deposition apparatus 1 is configured such that the first conveyer unit 410 is disposed above the second conveyer unit 420. Thus, after the moving unit 430, is separated from the substrate 2 in the unloading unit 300, the moving unit 430 is returned to the loading unit 200 via the second conveyer unit 420 formed below the first conveyer unit 410, so that the organic layer deposition apparatus 1 may have an improved space utilization efficiency.

In an embodiment, the deposition unit 100 of FIG. 1 may further include a deposition source replacement unit 190 disposed at a side of each organic layer deposition assembly. Although not particularly illustrated in the drawings, the deposition source replacement unit 190 may be formed as a cassette-type unit that may be removably affixed to the outside of each organic layer deposition assembly. Thus, a deposition source 110 (refer to FIG. 3) of the organic layer deposition assembly 100-1 may be easily replaced.

In FIG. 1, the organic layer deposition apparatus 1 has two sets of structures each including the loading unit 200, the deposition unit 100, the unloading unit 300, and the conveyer unit 400 that are arranged in parallel. That is, it can be seen that two organic layer deposition apparatuses 1 are arranged side by side (above and below in FIG. 1). In such an embodiment, a patterning slit sheet replacement unit 500 may be disposed between the two organic layer deposition apparatuses 1. That is, due to this configuration of structures, the two organic layer deposition apparatuses 1 share a patterning slit sheet replacement unit 500, resulting in improved space utilization efficiency as compared to a case where each organic layer deposition apparatus 1 has its own patterning slit sheet replacement unit 500.

Figure 3:
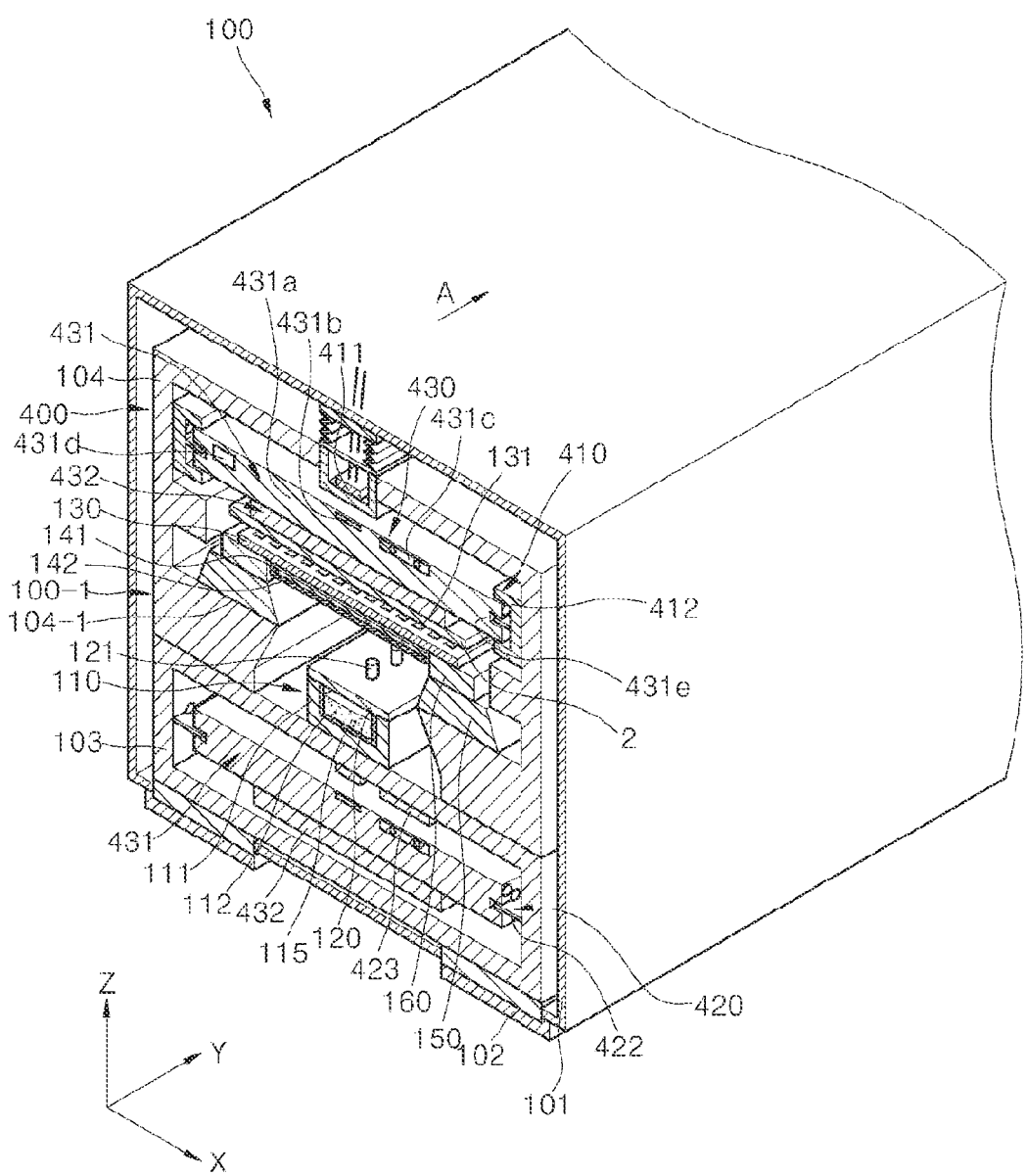
FIG. 3 is a schematic perspective view of the deposition unit of the organic layer deposition apparatus of FIG. 1, according to an embodiment of the present invention.
Figure 4:
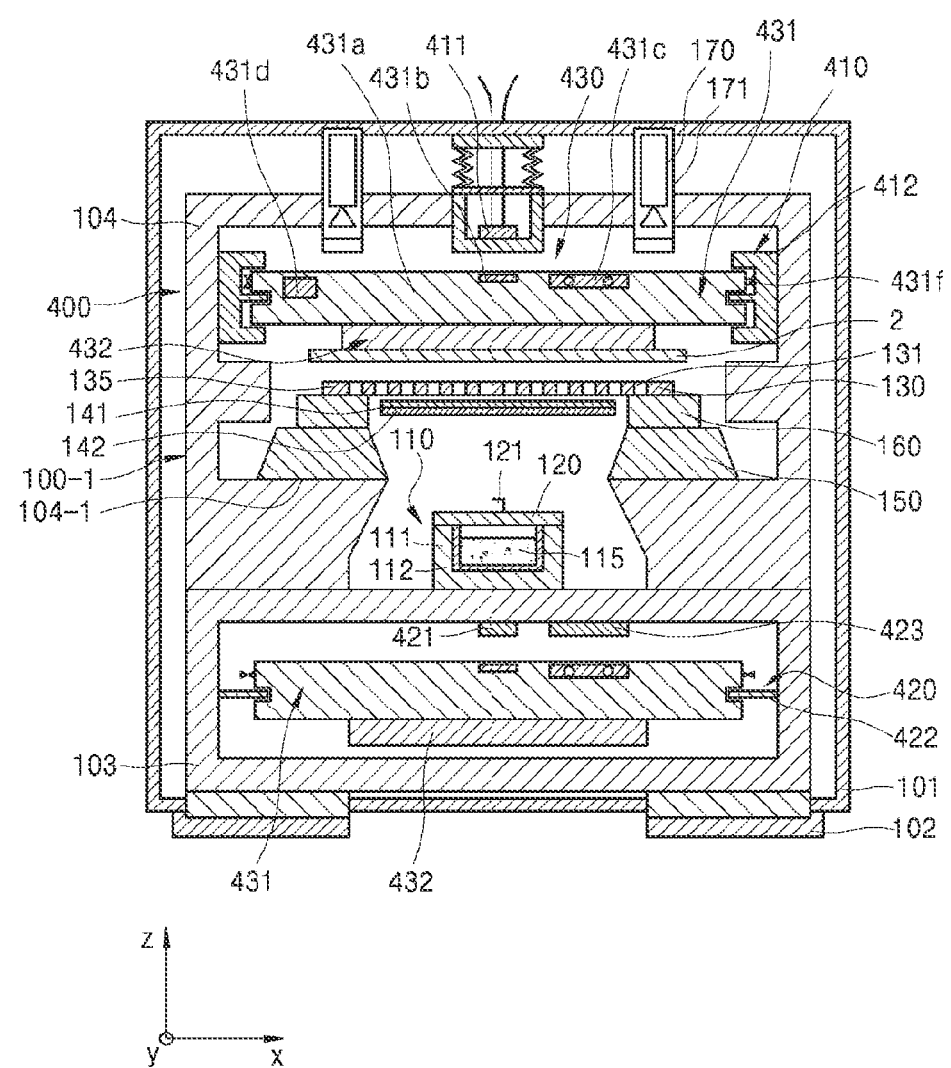
FIG. 4 is a schematic cross-sectional view of the deposition unit of FIG. 3, according to an embodiment of the present invention.

FIG. 3 is a schematic perspective view of the deposition unit 100 of the organic layer deposition apparatus 1 of FIG. 1, according to an embodiment of the present invention. FIG. 4 is a schematic cross-sectional view of the deposition unit 100 of FIG. 3, according to an embodiment of the present invention.

Hereinafter, an overall structure of the deposition unit 100 will be described.

The chamber 101 may be formed as a hollow box type chamber, and may accommodate the at least one organic layer deposition assembly 100-1 and the moving unit 430. In further detail, a foot 102 is formed so as to fix the deposition unit 100 on the ground, a lower housing 103 is disposed on the foot 102, and an upper housing 104 is disposed on the lower housing 103. The chamber 101 accommodates both the lower housing 103 and the upper housing 104. In this regard, a connection part of the lower housing 103 and the chamber 101 is sealed so that the inside of the chamber 101 is completely isolated from the outside. Due to the structure in which the lower housing 103 and the upper housing 104 are disposed on the foot 102 fixed on the ground, the lower housing 103 and the upper housing 104 may be maintained in a fixed position even when the chamber 101 is repeatedly contracted and expanded. Thus, the lower housing 103 and the upper housing 104 may serve as a reference frame within the deposition unit 100.

The upper housing 104 includes the organic layer deposition assembly 100-1 and the first conveyer unit 410 of the conveyer unit 400, and the lower housing 103 includes the second conveyer unit 420 of the conveyer unit 400. While the moving unit 430 is cyclically moving between the first conveyer unit 410 and the second conveyer unit 420, a deposition process is continuously performed.

Hereinafter, constituents of the organic layer deposition assembly 100-1 are described in further detail.

The organic layer deposition assembly 100-1 includes the deposition source 110, a deposition source nozzle unit 120, the patterning slit sheet 130, a shielding member 141, a mesh member 142, a first stage 150, and a second stage 160. In this regard, all the elements illustrated in FIGS. 3 and 4 may be arranged in the chamber 101 to be maintained in an appropriate vacuum state. This structure is desired to achieve the linearity of a deposition material.

The substrate 2, on which the deposition material 115 is to be deposited, is arranged in the chamber 101. The substrate 2 may be a substrate for a flat panel display device. For example, a large substrate of 40 inches or larger, such as a mother glass for manufacturing a plurality of flat panel displays, may be used as the substrate 2.

According to an embodiment, the deposition method may be performed with the substrate 2 being moved relative to the organic layer deposition assembly 100-1.

In a conventional deposition method using an FMM, the size of the FMM needs to be the same as that of a substrate. Thus, as the size of the substrate increases, the FMM also needs increase in size. Due to these problems, it is difficult to fabricate the FMM and to align the FMM in a precise pattern by elongation of the FMM.

To address these problems, in the organic layer deposition assembly 100-1 according to the present embodiment, deposition may be performed while the organic layer deposition assembly 100-1 and the substrate 2 are moved relative to each other. In other words, deposition may be continuously performed while the substrate 2, which faces the organic layer deposition assembly 100-1, is moved in the Y-axis direction shown in FIG. 3. That is, deposition is performed in a scanning manner while the substrate 2 is moved in the direction of arrow A as illustrated in FIG. 3. Although the substrate 2 is illustrated as being moved in the Y-axis direction in the chamber 101 in FIG. 3 when deposition is performed, the present invention is not limited thereto. For example, deposition may be performed while the organic layer deposition assembly 100-1 is moved in the Y-axis direction and the substrate 2 is held in a fixed position.

Thus, in the organic layer deposition assembly 100-1, the patterning slit sheet 130 may be much smaller than an FMM used in a conventional deposition method. In other words, in the organic layer deposition assembly 100-1, deposition is continuously performed, i.e., in a scanning manner, while the substrate 2 is moved in the Y-axis direction. Thus, at least one of the lengths of the patterning slit sheet 130 in X-axis and Y-axis directions may be much less than a length of the substrate 2. Since the patterning slit sheet 130 may be formed much smaller than the FMM used in a conventional deposition method, it is much easier to manufacture the patterning slit sheet 130. That is, a small patterning slit sheet 130 is more advantageous in manufacturing processes, including etching followed by precise elongation, welding, transferring, and washing processes, than the FMM used in conventional deposition methods. In addition, such a rectangular, striplike FMM is more advantageous for manufacturing a relatively large display device.

In order to perform deposition while the organic layer deposition assembly 100-1 and the substrate 2 are moved relative to each other as described above, the organic layer deposition assembly 100-1 and the substrate 2 may be spaced apart from each other by a certain distance. This is described below in more detail.

The deposition source 110 that contains and heats the deposition material 115 is disposed at a side opposite to (facing) a side of the substrate. As the deposition material 115 contained in the deposition source 110 is vaporized, deposition is performed on the substrate 2.

The deposition source 110 includes a crucible 111 that is filled with the deposition material 115, and a heater 112 that heats the crucible 111 so as to vaporize the deposition material 115 toward the deposition source nozzle unit 120.

The deposition source 110, in one embodiment, is disposed facing the substrate 2. In this regard, the organic layer deposition assemblies according to the present embodiment each may include different deposition source nozzles in performing deposition for forming common layers and pattern layers.

In one embodiment, the patterning slit sheet 130 may be disposed between the deposition source 110 and the substrate 2. The patterning slit sheet 130 may further include a frame 135 having a shape similar to a window frame. The patterning slit sheet 130 includes a plurality of patterning slits 131 arranged in the X-axis direction. The deposition material 115 that has been vaporized in the deposition source 110 passes through the nozzles 121 of the deposition source nozzle unit 120 and through the slits 131 of the patterning slit sheet 130, and is then deposited onto the substrate 2. In this regard, the patterning slit sheet 130 may be formed using the same method as that used to form an FMM, in particular, a stripe-type mask, e.g., etching. In this regard, a total number of patterning slits 131 may be greater than a total number of deposition source nozzles 121.

In one embodiment, the deposition source 110 (as well as the deposition source nozzle unit 120) and the patterning slit sheet 130 may be spaced apart from each other by a certain distance.

As described above, deposition is performed while the organic layer deposition assembly 100-1 is moved relative to the substrate 2. In order for the organic layer deposition assembly 100-1 to be moved relative to the substrate 2, the patterning slit sheet 130 is disposed to be spaced apart from the substrate 2 by a certain distance.

In a conventional deposition method using an FMM, deposition is performed with the FMM in close contact with a substrate in order to prevent formation of shadows on the substrate. However, when the FMM is placed in contact with the substrate, defects due to the contact between the substrate and the FMM may occur. In addition, since it is difficult to move the mask with respect to the substrate, the mask and the substrate are preferably formed to be at least approximately the same size. Accordingly, the mask should increase in size as the size of a display device increases. However, this becomes difficult as mask size increases.

To address these problems, in the organic layer deposition assembly 100-1 according to the present embodiment, the patterning slit sheet 130 is spaced apart by a certain distance from the substrate 2, on which a deposition material is to be deposited.

According to the present embodiment, deposition may be performed while a mask formed smaller than a substrate is moved with respect to the substrate. Such a smaller mask is easier to manufacture. In addition, defects due to contact between the substrate and the mask may be prevented. In addition, since it is unnecessary to closely contact the substrate with the mask during a deposition process, manufacturing speed may be improved.

Hereinafter, a particular disposition of each element of the upper housing 104 will be described.

The deposition source 110 and the deposition source nozzle unit 120 are disposed on a bottom portion of the upper housing 104. Accommodation portions 104-1 are respectively formed on both sides of the deposition source 110 and the deposition source nozzle unit 120, to have a protruding shape (i.e., protruding upward toward the slit sheet 130 as well as inward toward the deposition source 110). The first stage 150, the second stage 160, and the patterning slit sheet 130 are sequentially formed on the accommodation portions 104-1 in this order.

In this regard, the first stage 150 is formed to move in both X-axis and Y-axis directions so that the first stage 150 aligns the patterning slit sheet 130 in the X-axis and Y-axis directions. That is, the first stage 150 includes a plurality of actuators so that the first stage 150 can be moved in the X-axis and Y-axis directions with respect to the upper housing 104.

The second stage 160 is formed to move in a Z-axis direction so as to align the patterning slit sheet 130 in the Z-axis direction. That is, the second stage 160 includes a plurality of actuators and is formed to move in the Z-axis direction with respect to the first stage 150.

The patterning slit sheet 130 is disposed on the second stage 160. The patterning slit sheet 130 is disposed on the first stage 150 and the second stage 160 so as to move in the X-axis, Y-axis, and Z-axis directions, so as to properly align the substrate 2 and the patterning slit sheet 130.

In addition, the upper housing 104, the first stage 150, and the second stage 160 may guide a flow path of the deposition material 115 such that the deposition material 115 discharged through the deposition source nozzles 121 is not dispersed too widely. That is, the flow path of the deposition material 115 is sealed by the upper housing 104, the first stage 150, and the second stage 160, and thus, the movement of the deposition material 115 in the X-axis and Y-axis directions may be thereby concurrently or simultaneously guided.

The shielding member 141 and the mesh member 142 may be further disposed between the patterning slit sheet 130 and the deposition source 110. The shielding member 141 may perform a function of blocking some deposition material 115 emitted from the deposition source 110. Also, the mesh member 142 may be disposed on a side of the shielding member 141 to prevent dropping of deposition material 115 deposited on the shielding member 141. This will be further described in detail with reference to FIG. 5 below.

Hereinafter, the conveyer unit 400 that conveys the substrate 2, on which the deposition material 115 is to be deposited, is described in more detail. Referring to FIGS. 3 and 4, the conveyer unit 400 includes the first conveyer unit 410, the second conveyer unit 420, and the moving unit 430.

The first conveyer unit 410 conveys in an in-line manner the moving unit 430, which includes the carrier 431 and an electrostatic chuck 432 attached thereto, and also conveys the substrate 2 attached to the moving unit 430, so that an organic layer may be formed on the substrate 2 by the organic layer deposition assembly 100-1.

The second conveyer unit 420 returns to the loading unit 200 the moving unit 430 from which the substrate 2 has been separated in the unloading unit 300 after one deposition cycle is completed. The second conveyer unit 420 includes a coil 421, roller guides 422, and a charging track 423.

The moving unit 430 includes the carrier 431 that is conveyed along the first conveyer unit 410 and the second conveyer unit 420, as well as the electrostatic chuck 432 that is coupled to a surface of the carrier 431 and to which the substrate 2 is attached.

Hereinafter, each element of the conveyer unit 400 will be described in more detail.

The carrier 431 of the moving unit 430 will now be described in detail.

The carrier 431 includes a main body part 431a, a magnet rail 431b, contactless power supply (CPS) modules 431c, a power supply unit 431d, and guide grooves (not shown).

The main body part 431a constitutes a base part of the carrier 431 and may be formed of a magnetic material, such as iron or steel. In this regard, due to a magnetic force between the main body part 431a and the respective magnetically suspended bearings (not shown), which are described below, the carrier 431 may be maintained spaced apart from guide members 412 by a certain distance.

The guide grooves (not shown) may be respectively formed at both sides of the main body part 431a and each may accommodate a guide protrusion (not shown) of the guide member 412.

The magnetic rail 431b may be formed along a center line of the main body part 431a in a direction where the main body part 431a proceeds (i.e., along the center line of the main body part 431a that extends in the direction of movement of the moving unit 430). The magnetic rail 431b and a coil 411, which are described below in more detail, may together constitute a linear motor, and the carrier 431 may be conveyed in the direction of an arrow A by the linear motor.

The CPS modules 431c and the power supply unit 431d may be respectively formed on both sides of the magnetic rail 431b in the main body part 431a, although embodiments of the invention contemplate any suitable position for either part). The power supply unit 431d includes a battery (e.g., a rechargeable battery) that provides power so that the electrostatic chuck 432 can chuck the substrate 2 and maintain operation. The CPS modules 431c are wireless charging modules that charge the power supply unit 431d. In particular, the charging track 423 formed in the second conveyer unit 420, which is described below, is connected to an inverter (not shown), and thus, when the carrier 431 is transferred to the second conveyer unit 420, a magnetic field is formed between the charging track 423 and the CPS modules 431c so as to supply power to the CPS modules 431c. The power supplied to the CPS modules 431c is used to charge the power supply unit 431d.

The electrostatic chuck 432 may include an electrode embedded in a main body formed of ceramic, wherein the electrode is supplied with power. The substrate 2 is attached onto a surface of the main body of the electrostatic chuck 432 as a high voltage is applied to the electrode.

Hereinafter, an operation of the moving unit 430 is described in more detail.

The magnetic rail 431b of the main body part 431a and the coil 411 may be combined with each other to constitute an operation unit. In this regard, the operation unit may be a linear motor. The linear motor has a low frictional coefficient, little position error, and a very high degree of position determination, as compared to a conventional slide guide system. As described above, the linear motor may include the coil 411 and the magnetic rail 431b. The magnetic rail 431b is linearly disposed on the carrier 431, and a plurality of the coils 411 may be disposed at an inner side of the chamber 101 and separated from the rail 431b by a certain distance while facing the magnetic rail 431b. Since the magnetic rail 431b is disposed on the carrier 431 instead of the coil 411, the carrier 431 may be operable without power being supplied thereto. In this regard, the coil 411 may be formed in an atmosphere (ATM) box in an air atmosphere, and the carrier 431, to which the magnetic rail 431b is attached, may be moved in the chamber 101 while the chamber 101 maintains a vacuum.

The organic layer deposition assembly 100-1 of the organic layer deposition apparatus 1 according to the present embodiment may further include the camera 170 for an aligning process. In detail, the camera 170 may align in real time a mark formed on the patterning slit sheet 130 and a mark formed on the substrate 2. In this regard, the camera 170 is disposed to operate accurately in the chamber 101 while it maintains a vacuum during deposition. For this, the camera 170 may be installed in a camera accommodation unit 171 in an atmospheric state, i.e. one which maintains an atmosphere yet remains transparent.

Hereinafter, the shielding member 141 and the mesh member 142 of the organic layer deposition apparatus 1 according to the current embodiment of the present invention will be described in detail.

Figure 5:
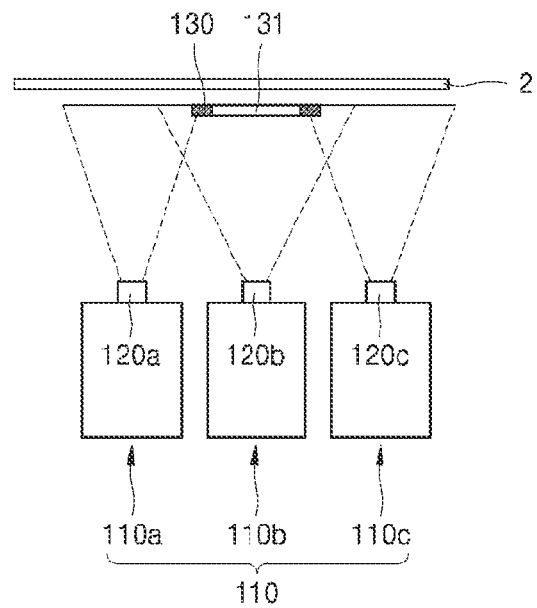
FIGS. 5 and 6 illustrate the deposition source, a shielding member, and a mesh member of FIG. 3, according to an embodiment of the present invention.
Figure 6:
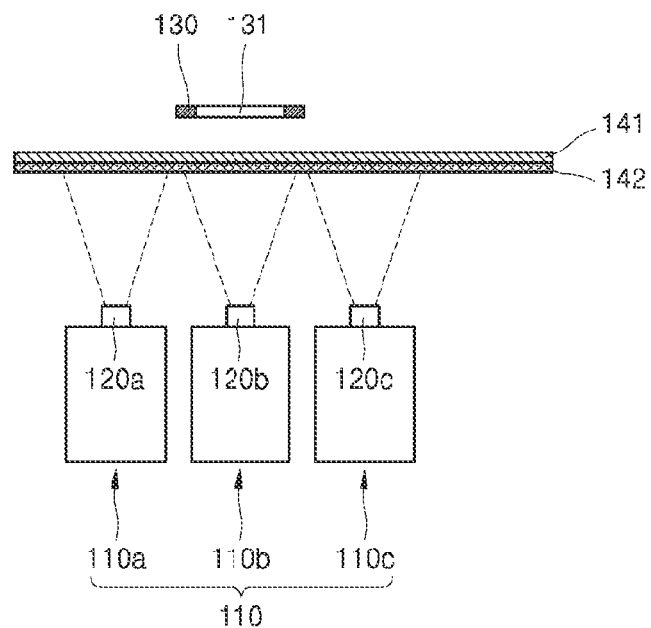
Figure 7:
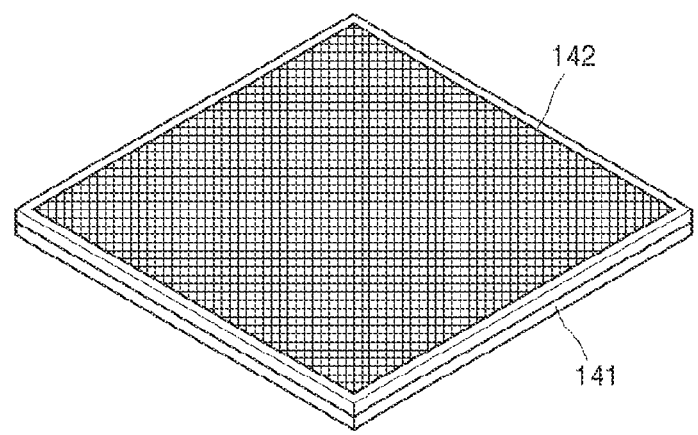
FIG. 7 is a detailed view of the shielding member and the mesh member of FIG. 6, according to an embodiment of the present invention.

FIGS. 5 and 6 illustrate the deposition source 110, the shielding member 141, and the mesh member 142 of FIG. 3 according to an embodiment of the present invention, and FIG. 7 is a detailed view of the shielding member 141 and the mesh member 142 of FIG. 6.

Referring to FIGS. 5, 6, and 7, the shielding member 141 and the mesh member 142 may (but not necessarily) be further included between the patterning slit sheet 130 and the deposition source 110. The shielding member 141 may perform the function of blocking the deposition material 115 emitted from the deposition source 110. Also, the mesh member 142 may be formed on a side of the shielding member 141 to prevent excess deposition material 115 deposited on the shielding member 141 from dripping down.

That is, according to the current embodiment of the present invention, the shielding member 141 is disposed between the deposition source 110 and the patterning slit sheet 130 so as to function as a main shutter that prevents deposition of a deposition material on the patterning slit sheet 130 during a deposition standby mode.

In more detail, in the organic layer deposition apparatus 100, frequent turning on and off of power to the deposition source 110 has to be avoided to maintain a constant temperature until all of the deposition material 115 is used once it has started to operate, in order to prevent deformation of the deposition material 115 (which may be an organic material). In this case, after the organic layer deposition apparatus 100 has deposited sufficient material on the substrate 2, the deposition material 115 must be prevented from further discharge into the chamber 101 through the patterning slit sheet 130, such as in a deposition standby mode before deposition is performed on other substrates. During this time, the deposition material 115 is accumulated on the patterning slit sheet 130 if no shielding member 141 is present.

To this end, the shielding member 141 is included between the deposition source 110 and the patterning slit sheet 130 in the chamber 101, so as to block the deposition material 115 emitted from the deposition source 110. Thus, when the shielding member 141 is interposed between the deposition source 110 and the patterning slit sheet 130, attachment of the deposition material 115 discharged from the deposition source 110 to non-targeted portions of the chamber 101, including the patterning slit sheet 130, may be minimized. Deposition material 115 discharged from the deposition source 110 is deposited on shielding member 141 rather than on some other undesired target or location.

As illustrated in FIG. 6, when the substrate 2 does not pass through the organic layer deposition assembly 100-1, the shielding member 141 may cover the deposition source 110 so that the deposition material 115 discharged from the deposition source 110 is not smeared on the patterning slit sheet 130.

As illustrated in FIG. 5, when the substrate 2 starts to enter the organic layer deposition assembly 100-1, the shielding member 141, which is covering the deposition source 110, moves to open a movement path of the deposition material 115, and the deposition material 115 discharged from the deposition source 110 passes through the patterning slit sheet 130 to be deposited on the substrate 2.

The mesh member 142 may be further formed on a side of the shielding member 141, and in particular on the side facing the deposition source 110. The mesh member 142 performs the function of preventing dripping of the deposition material 115 deposited on the shielding member 141.

In further detail, during a deposition operation, a large amount of deposition material can be deposited on the shielding member 141. When a sufficiently large amount of deposition material is deposited, the deposition material might form droplets that drip down due to their weight. The dropping deposition material functions as particles in the chamber 101, that is, as impurities, and if drops of the deposition material drip down toward the deposition source 110, it also affects a layer formation flux and may degrade product quality. In addition, if a large amount of deposition material is deposited on the shielding member 141 and enough deposition material drips down, equipment can no longer be driven, thus decreasing the equipment operating ratio and production capacity.

In order to solve the above problems, the mesh member 142 is further formed on a side of the shielding member 141 in the organic layer deposition apparatus 1 according to the current embodiment of the present invention so as to prevent dropping of the deposition material 115 deposited on the shielding member 141. When the mesh member 142 is coupled to the side of the shielding member 141, the deposition material is deposited in gaps of the mesh member 142, which has a meshlike configuration that forms a fine sieve, so that mesh member 142 easily catches the attaching deposition material, and accordingly, dropping of the deposition material may be prevented.

Experiments showed that an organic deposition material started to drip after about 60 to 70 hours of process time if no mesh member was included. However, when a mesh member was used, dripping of an organic material did not occur even after 250 hours of process time.

According to the current embodiment of the present invention, as dripping of the deposition material deposited onto the shielding member 141 is prevented, product quality may be improved and equipment operating ratio and productivity may be increased.

Figure 8:
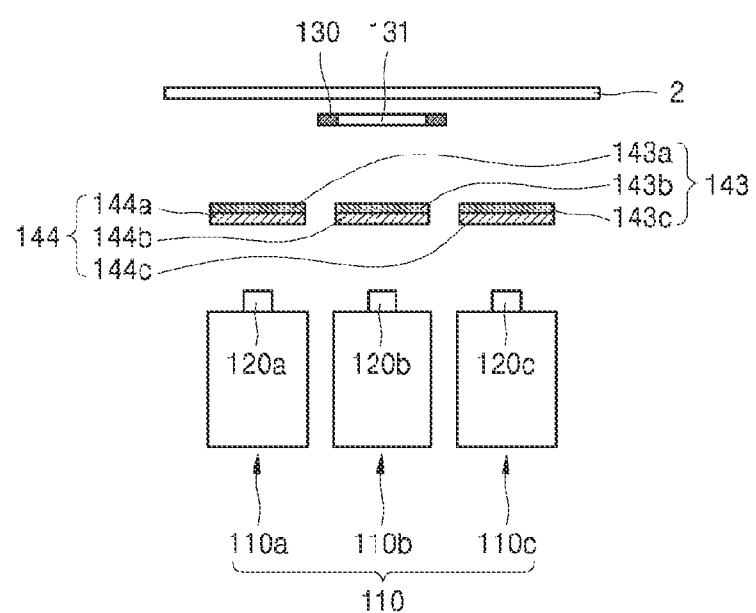
FIG. 8 illustrates the shielding member and the mesh member of FIG. 3, according to another embodiment of the present invention.

FIG. 8 illustrates a shielding member 143 and a mesh member 144 according to another embodiment of the present invention.

According to this embodiment of the present invention, the shielding member 143 is disposed between the deposition source 110 and the patterning slit sheet 130, and in particular between the patterning slit sheet 130 and each of three deposition sources 110*a*, 110*b*, and 110*c* of the organic layer deposition assembly 100-1 (see FIG. 1) individually, so as to function as a source shutter that is used in controlling deposition from each of the three deposition sources 110*a*, 110*b*, and 110*c* individually. That is, three shielding members 143*a*, 143*b*, and 143*c* are respectively formed in front of the deposition sources 110*a*, 110*b*, and 110*c* so that a deposition material from each individual one of the deposition sources 110*a*, 110*b*, and 110*c* may be blocked, and even if one of the deposition sources 110*a*, 110*b*, and 110*c* becomes defective, deposition may be performed by using the other deposition sources without interruption.

Here, the shielding member 143 in the form of a source shutter, however, is disposed relatively close to the deposition source 110, and thus a large amount of deposition material is deposited, and the deposition material may easily drop. When a deposition material drops from the shielding member 143, the deposition material may fall onto, and block up, the deposition source nozzle unit 120, thus degrading product characteristics.

In order to solve the above problem, the mesh member 144 is further formed on a side of the shielding member 143 that prevents dropping of the deposition material 115 deposited on the shielding member 143. That is, three mesh members 144*a*, 144*b*, and 144*c* are respectively coupled to sides of the three shielding members 143*a*, 143*b*, and 143*c*.

When the mesh member 144 is coupled to the side of the shielding member 143, the deposition material is deposited upon the sieve of the mesh member 144, and the mesh member 144 easily catches the attaching deposition material. Thus, dropping of the deposition material may be prevented.

Figure 9:
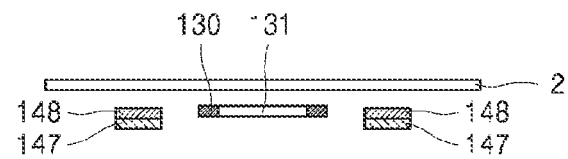
FIG. 9 illustrates the shielding member and the mesh member of FIG. 3, according to another embodiment of the present invention.
Figure 9:
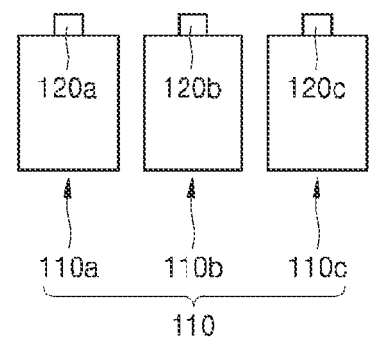

FIG. 9 illustrates a shielding member 147 and a mesh member 148 according to another embodiment of the present invention.

According to this embodiment of the present invention, the shielding member 147 is disposed between the deposition source 110 and the substrate 2 while being positioned laterally outside the patterning slit sheet 130 so as to function as a blinder for preventing deposition of an organic material in a non-layer forming area of the substrate 2, i.e., an area of substrate 2 upon which no organic material is to be deposited. That is, the shielding member 147 is formed to move together with the substrate 2 while it covers the non-layer forming area of the substrate 2 during movement of the substrate 2 (e.g., a boundary portion) so that the non-layer forming area of the substrate 2 is covered. Accordingly, deposition of an organic material in the non-layer forming area of the substrate 2 may be easily prevented without any additional structure.

Also, in the organic layer deposition apparatus 1 according to the current embodiment of the present invention, a mesh member 148 is further formed on a side of the shielding member 147 in the form of a source shutter, in detail, on a side of the shielding member 147 facing the deposition source 110, thereby preventing dripping of the deposition material 115 deposited on the shielding member 147. When the mesh member 148 is coupled to the side of the shielding member 147, the deposition material is deposited in gaps of the mesh member 148, which is in the form of a fine sieve, so that the mesh member 142 easily catches the attaching deposition material. Thus, dropping of the deposition material back down toward the deposition source 110 may be prevented.

Figure 10:
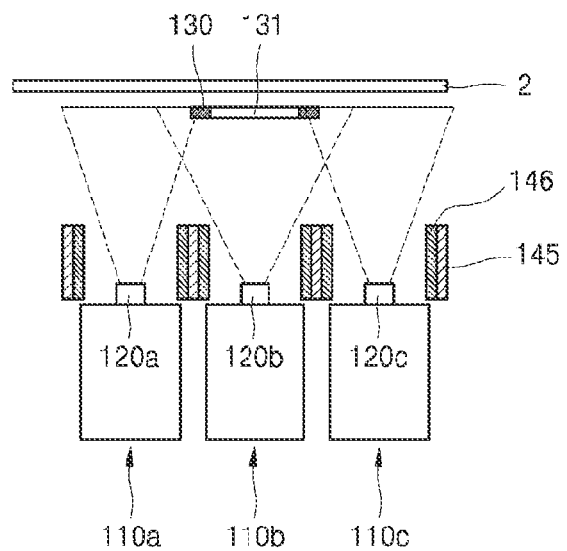
FIG. 10 illustrates the shielding member and the mesh member of FIG. 3, according to another embodiment of the present invention.

FIG. 10 illustrates a shielding member 145 and a mesh member 146 according to another embodiment of the present invention.

According to this embodiment of the present invention, the shielding member 145 is formed at a side of the deposition source 110 to surround the deposition source 110 and in the form of an angle-limiting plate that adjusts an angle of a deposition material being discharged, thereby guiding a path of the deposition material that is vaporized from the deposition source 110. That is, the shielding member 145 is oriented perpendicular to the surface of the substrate 2 and/or parallel to the direction of spray from the deposition source 110, so that the shielding member 145 creates a discharge path, thus guiding or channeling a deposition material that is vaporized from the deposition source 110, thereby improving directivity of the deposition material. A portion of the deposition material vaporized from the deposition source 110, which proceeds almost in a perpendicular direction, does not collide with the shielding member 145 but proceeds to the substrate 2. On the other hand, another portion of the deposition material vaporized from the deposition source 110 that proceeds obliquely at a predetermined angle or less collides with the shielding member 145 and is deposited on the shielding member 145. The directionality of the deposition material is improved by the shielding member 145, and shadows may be significantly reduced accordingly.

However, the shielding member 145, which is in the form of an angle-limiting plate, is relatively close to the deposition source 110 (i.e. positioned proximate thereto), and thus, a large amount of deposition material is deposited thereon, and the deposition material may easily form drops. When the deposition material drops from the shielding member 145, which is in the form of an angle-limiting plate, the deposition material may stop up or clog the deposition source nozzle unit 120, or cause interference in an angle of the deposition material being sublimed, and may vary a sublimation flux and affect the uniformity of a deposition layer, thereby degrading product characteristics.

In order to prevent the above problem, the mesh member 146 is further formed on two sides of the shielding member 145, so as to prevent dropping of the deposition material 115 deposited on the shielding member 145. When the mesh member 146 is coupled to the sides of the shielding member 145, the deposition material is deposited upon the mesh member 146, and the mesh member 146 thus catches the attaching deposition material, preventing dripping of the deposition material.

Figure 11:
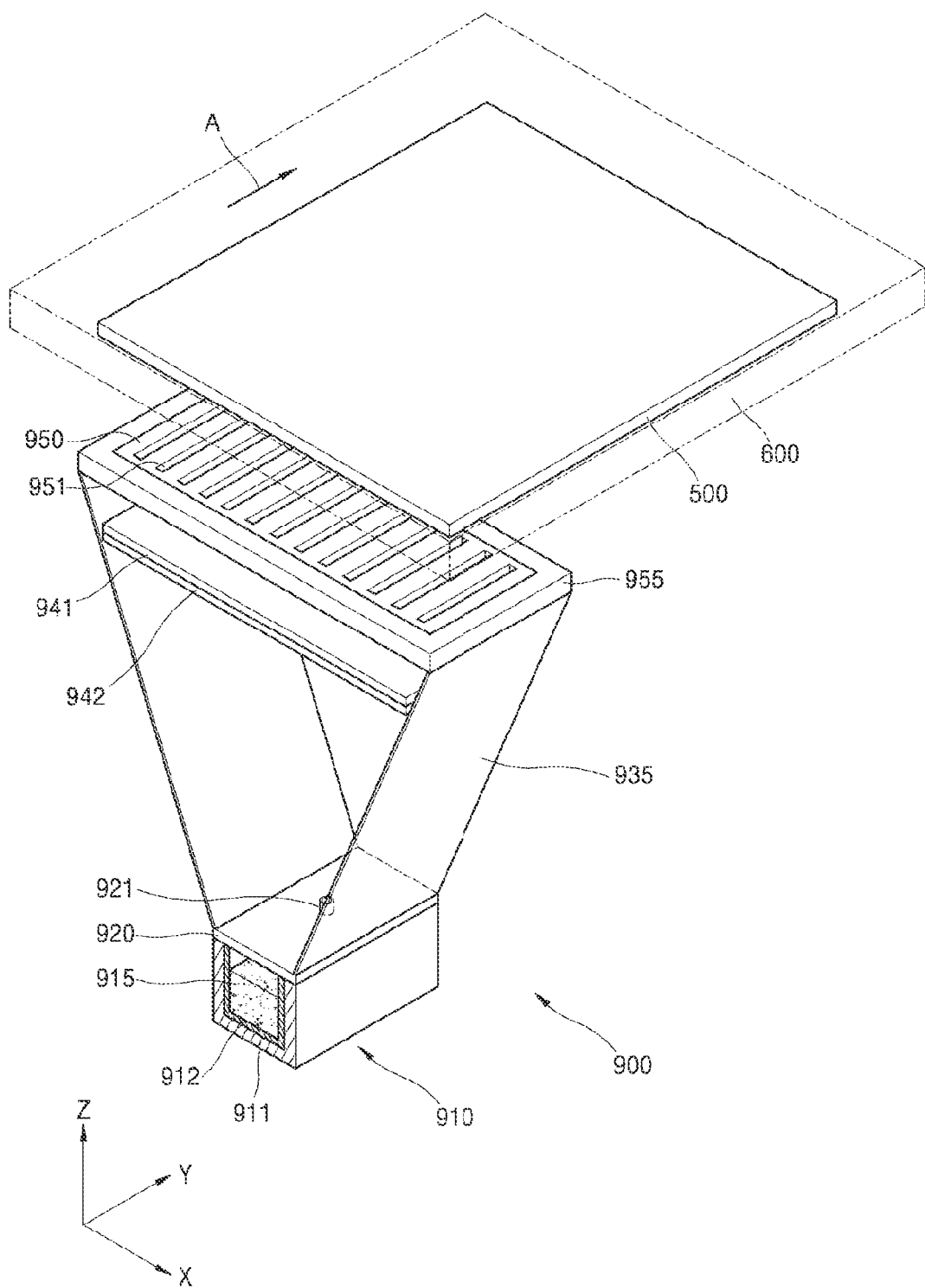
FIG. 11 illustrates an organic layer deposition assembly according to another embodiment of the present invention.

FIG. 11 is a schematic perspective view of an organic layer deposition assembly 900 according to another embodiment of the present invention.

Referring to FIG. 11, the organic layer deposition assembly 900 includes a deposition source 910, a deposition source nozzle unit 920, and a patterning slit sheet 950. Also, the organic layer deposition assembly 900 further includes a shielding member 941 and a mesh member 942.

The deposition source 910 includes a crucible 911 that is filled with a deposition material 915, and a heater 912 that heats the crucible 911 so as to vaporize the deposition material 915 toward the deposition source nozzle unit 920. The deposition source nozzle unit 920 is disposed at a side of the deposition source 910, and a plurality of deposition source nozzles 921 are arranged along a Y-axis direction in the deposition source nozzle unit 920. The patterning slit sheet 950 and a frame 955 are further included between the deposition source 910 and the substrate 2, and the sheet 950 has a plurality of patterning slits 951. Also, the deposition source 910, the deposition source nozzle unit 920 and the patterning slit sheet 950 are coupled to each other via a connecting member 935.

The arrangement of the deposition source nozzles 921 included in the deposition source nozzle unit 920 are different from that of the above-described embodiments of the present invention, and thus will be described in detail below.

The deposition source nozzle unit 920 is disposed at a side of the deposition source 910, in detail, at a side of the deposition source 910 that faces the substrate 2. Also, the deposition source nozzles 921 are formed in the deposition source nozzle unit 920. A deposition material 915 vaporized in the deposition source 910 passes through the deposition source nozzle unit 920 to proceed to the substrate 2, which is the deposition object or target. In this case, if a plurality of deposition source nozzles 921 are arranged in an X-axis direction, distances between the deposition source nozzles 921 and the respective patterning slits 951 are variable, and a shadow is formed due to deposition material that is discharged from the deposition source nozzles 921 that are relatively far from the patterning slit 951. Accordingly, by disposing just one deposition source nozzle 921 in the X-axis direction, generation of shadows may be significantly reduced.

Figure 12:
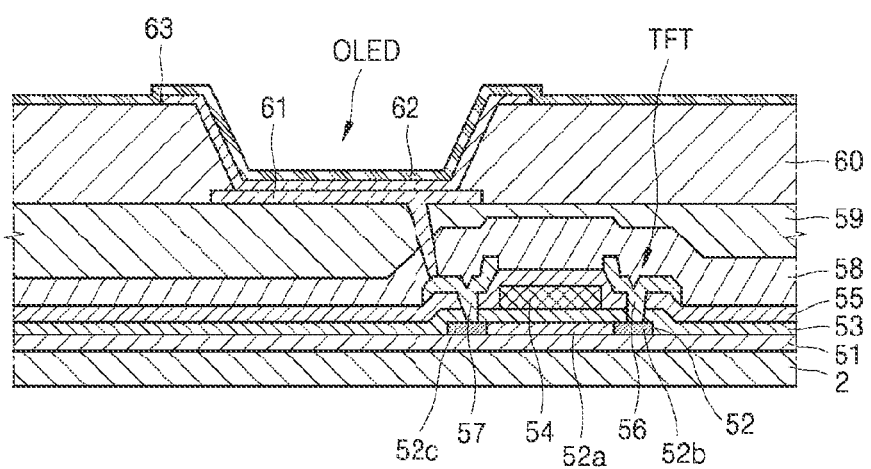
FIG. 12 is a cross-sectional view of an active matrix-type organic light-emitting display device manufactured using the organic layer deposition apparatus, according to an embodiment of the present invention.

FIG. 12 is a cross-sectional view of an active matrix-type organic light-emitting display device manufactured using the organic layer deposition apparatus 1, according to an embodiment of the present invention.

Referring to FIG. 12, the active matrix organic light-emitting display device 10 according to the current embodiment is formed on a substrate 2. The substrate 2 may be formed of a transparent material, for example, glass, plastic, or metal. An insulating layer 51, such as a buffer layer, is formed on an entire surface of the substrate 2.

A thin film transistor (TFT), a capacitor (not shown), and an organic light-emitting diode (OLED) are disposed on the insulating layer 51, as illustrated in FIG. 12.

A semiconductor active layer 52 is formed on an upper surface of the insulating layer 51 in a set or predetermined pattern. A gate insulating layer 53 is formed to cover the semiconductor active layer 52. The semiconductor active layer 52 may include a p-type or n-type semiconductor material.

A gate electrode 54 of the TFT is formed on a region of the gate insulating layer 53 corresponding to the semiconductor active layer 52. An interlayer insulating layer 55 is formed to cover the gate electrode 54. The interlayer insulating layer 55 and the gate insulating layer 53 are etched by, for example, dry etching, to form contact holes exposing parts of the semiconductor active layer 52.

Source/drain electrodes 56, 57 are formed on the interlayer insulating layer 55 to contact the semiconductor active layer 52 through the contact holes. A passivation layer 58 is formed to cover the source/drain electrodes 56, 57, and is etched to expose a part of one of the source/drain electrodes 56, 57. An insulating layer (not shown) may be further formed on the passivation layer 58 so as to planarize the passivation layer 58.

In addition, the OLED displays set or predetermined image information by emitting red, green, or blue light. The OLED includes a first electrode 61 disposed on the passivation layer 58. The first electrode 61 is electrically connected to the drain electrode 57 of the TFT.

A pixel-defining layer 60 is formed to cover the first electrode 61. An opening is formed in the pixel-defining layer 60, and an organic layer 62, including an emission layer (EML), is formed in a region defined by the opening. A second electrode 63 is formed on the organic layer 62.

The pixel-defining layer 60, which defines individual pixels, is formed of an organic material. The pixel-defining layer 60 also planarizes the surface of a region of the substrate 30 in which the first electrode 61 is formed, and in particular, the surface of the insulating layer 59.

The first electrode 61 and the second electrode 63 are insulated from each other, and respectively apply voltages of opposite polarities to the organic layer 62 to induce light emission.

The organic layer 62, including an EML, may be formed of a low-molecular weight organic material or a high-molecular weight organic material. When a low-molecular weight organic material is used, the organic layer 62 may have a single or multi-layer structure including a hole injection layer (HIL), a hole transport layer (HTL), the EML, an electron transport layer (ETL), and/or an electron injection layer (EIL). Non-limiting examples of available organic materials may include copper phthalocyanine (CuPc), N,N'-di(naphthalene-1-yl)-N,N'-diphenyl-benzidine (NPB), and tris-8-hydroxyquinoline aluminum ($Alq_3$).

The organic layer 62, including an EML, may be formed using the organic layer deposition apparatus 1 illustrated in FIG. 1. That is, an organic layer deposition apparatus includes a deposition source that discharges a deposition material, a deposition source nozzle unit that is disposed at a side of the deposition source and includes a plurality of deposition source nozzles formed therein, and a patterning slit sheet that faces the deposition source nozzle unit. The patterning slit sheet includes a plurality of patterning slits formed therein, where the slits are disposed to be spaced apart by a set or predetermined distance from a substrate on which the deposition material is to be deposited. In addition, the deposition material discharged from the organic layer deposition apparatus 1 (refer to FIG. 1) is deposited on the substrate 2 (refer to FIG. 1) while the organic layer deposition apparatus 1 and the substrate 2 are moved relative to each other.

After the organic layer 62 is formed, the second electrode 63 may be formed by the same deposition method used to form the organic layer 62.

The first electrode 61 may function as an anode, and the second electrode 63 may function as a cathode. Alternatively, the first electrode 61 may function as a cathode, and the second electrode 63 may function as an anode. The first electrode 61 may be patterned to correspond to individual pixel regions, and the second electrode 63 may be formed to cover all the pixels.

The first electrode 61 may be formed as a transparent electrode or a reflective electrode. Such a transparent electrode may be formed of indium tin oxide (ITO), indium zinc oxide (IZO), zinc oxide (ZnO), or indium oxide ($In_2O_3$). Such a reflective electrode may be formed by forming a reflective layer from silver (Ag), magnesium (Mg), aluminum (Al), platinum (Pt), palladium (Pd), gold (Au), nickel (Ni), neodymium (Nd), iridium (Ir), chromium (Cr) or a compound thereof, and then forming a layer of ITO, IZO, ZnO, or $In_2O_3$ on the reflective layer. The first electrode 61 may be formed by forming a layer by, for example, sputtering, and then patterning the layer by, for example, photolithography.

The second electrode 63 may also be formed as a transparent electrode or a reflective electrode. When the second electrode 63 is formed as a transparent electrode, the second electrode 63 is used as a cathode. To this end, such a transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof on a surface of the organic layer 62, and forming an auxiliary electrode layer or a bus electrode line thereon from ITO, IZO, ZnO, $In_2O_3$, or the like. When the second electrode 63 is formed as a reflective electrode, the reflective layer may be formed by depositing Li, Ca, LiF/Ca, LiF/Al, Al, Ag, Mg, or a compound thereof on the entire surface of the organic layer 62. The second electrode 63 may be formed using the same deposition method used to form the organic layer 62 described above.

The organic layer deposition apparatuses according to the embodiments of the present invention described above may be applied to form an organic layer or an inorganic layer of an organic TFT, and to form layers from various materials.

As described above, the one or more embodiments of the present invention provide organic layer deposition apparatuses that are suitable for use in the mass production of a large substrate and enable high-definition patterning. Embodiments of the invention also include methods of manufacturing organic light-emitting display devices by using the same, and organic light-emitting display devices manufactured using the methods.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic light-emitting display device, the method comprising:
   conveying a moving unit into a chamber, the moving unit having a substrate coupled thereto, the conveying performed by a first conveyer unit installed to pass into the chamber;
   forming an organic layer on the substrate by depositing a deposition material from an organic layer deposition assembly on the substrate while the substrate is moved relative to the organic layer deposition assembly, the organic layer deposition assembly being positioned in the chamber and spaced apart from the substrate by a predetermined distance;
   after the substrate is separated from the moving unit, conveying the moving unit with a second conveyer unit installed to pass through the chamber;
   replacing a deposition source by a deposition source replacement unit; and
   replacing a patterning slit sheet by a patterning slit sheet replacement unit,
   wherein in the chamber, the first conveyer unit is disposed above the second conveyer unit,
   wherein the forming an organic layer further comprises blocking the deposition material discharged from the organic layer deposition assembly from being deposited upon the substrate, the blocking being performed with a shielding member having a mesh member coupled thereto,
   wherein the moving unit circulates by moving through an upper part and lower part of the chamber,
   wherein the deposition source replacement unit is located at a first side of the chamber, and
   wherein the patterning slit sheet replacement unit is located at a second side of the chamber opposite the first side of the chamber.

2. The method of claim 1, wherein the organic layer deposition assembly comprises:
   the deposition source for discharging a deposition material;
   a deposition source nozzle unit disposed at a side of the deposition source and comprising a plurality of deposition source nozzles; and
   the patterning slit sheet facing the deposition source nozzle unit and comprising a plurality of arranged patterning slits,
   wherein the patterning slits are shaped and arranged so that deposition material discharged from the deposition source passes through the patterning slit sheet to be deposited on the substrate in a predetermined pattern.

3. The method of claim 2, wherein the shielding member is configured to be disposed between the substrate and the deposition source to prevent the deposition material vaporized from the deposition source from being deposited on the substrate,
   wherein the mesh member is disposed on a side of the shielding member so as to prevent dripping of the deposition material from the shielding member.

4. The method of claim 2, wherein the shielding member is operably movable so as to prevent deposition of the deposition material upon the substrate.

5. The method of claim 4, wherein the shielding member is configured to be moved between the deposition source and the patterning slit sheet.

6. The method of claim 4, wherein the mesh member is coupled to the shielding member so as to move with the shielding member.

7. The method of claim 2, wherein the shielding member is disposed at a side of the deposition source and is positioned and shaped so as to channel the deposition material vaporized from the deposition source toward the substrate.

8. The method of claim 7, wherein the shielding member is shaped so as to at least partially surround the deposition source.

9. The method of claim 7, wherein the mesh member is coupled to the shielding member and both the mesh member and the shielding member are positioned proximate to a side of the deposition source.

10. The method of claim 2, wherein the organic layer deposition assembly comprises:
    a plurality of deposition sources; and
    a plurality of shielding members that are movably positionable between respective ones of the plurality of deposition sources and the patterning slit sheet.

11. The method of claim 10, wherein the plurality of shielding members are positionable to prevent deposition of the deposition material on the substrate.

12. The method of claim 1, wherein the shielding member is shaped and positioned to cover a boundary area of the substrate.

13. The method of claim 12, wherein the shielding member is configured to move along with the substrate while covering the boundary area of the substrate.

\* \* \* \* \*